(12) United States Patent
Koo et al.

(10) Patent No.: US 7,476,849 B2
(45) Date of Patent: *Jan. 13, 2009

(54) TECHNIQUE FOR MONITORING AND CONTROLLING A PLASMA PROCESS

(75) Inventors: Bon-Woong Koo, Andover, MA (US); Ludovic Godet, Beverly, MA (US); Vassilis Panayotis Vourloumis, Peabody, MA (US); Vikram Singh, North Andover, MA (US); Ziwei Fang, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 184 days.

This patent is subject to a terminal disclaimer.

(21) Appl. No.: 11/371,907

(22) Filed: Mar. 10, 2006

(65) Prior Publication Data

US 2007/0210248 A1    Sep. 13, 2007

(51) Int. Cl.
*H01J 49/40* (2006.01)
*G01N 27/26* (2006.01)
*G01N 33/00* (2006.01)

(52) U.S. Cl. .................. 250/287; 250/288; 250/299; 250/281; 250/282; 315/111.21; 315/111.31

(58) Field of Classification Search ......... 250/286–288, 250/292, 299, 281–283, 305, 306, 423 R, 250/492.2, 492.21; 315/111.01, 111.21, 315/111.31, 111.81

See application file for complete search history.

(56) References Cited

U.S. PATENT DOCUMENTS 3,911,314 A * 10/1975 Schulz et al. ............ 313/361.1
4,362,936 A    12/1982 Hofmann et al.
5,059,739 A *  10/1991 Hendriksen ................ 585/513

5,218,204 A    6/1993  Houk et al.

(Continued)

FOREIGN PATENT DOCUMENTS

WO    98056029 A    12/1998

(Continued)

OTHER PUBLICATIONS

Pollard, J.E., et al.; "Time-Resolved Mass and Energy Analysis by Position-Sensitive Time-Of-Flight Detection"; Review of Scientific Instruments, AIP, Melville, NY, vol. 60, No. 10; Oct. 1, 1989, pp. 3171-3180.

(Continued)

*Primary Examiner*—Bernard E Souw

(57) ABSTRACT

An in-situ ion sensor is disclosed for monitoring ion species in a plasma chamber. The ion sensor may comprise: a drift tube; an extractor electrode and a plurality of electrostatic lenses disposed at a first end of the drift tube, wherein the extractor electrode is biased to attract ions from a plasma in the plasma chamber, and wherein the plurality of electrostatic lenses cause at least one portion of the attracted ions to enter the drift tube and drift towards a second end of the drift tube within a limited divergence angle; an ion detector disposed at the second end of the drift tube, wherein the ion detector detects arrival times associated with the at least one portion of the attracted ions; and a housing for the extractor, the plurality of electrostatic lenses, the drift tube, and the ion detector, wherein the housing accommodates differential pumping between the ion sensor and the plasma chamber.

21 Claims, 14 Drawing Sheets

U.S. PATENT DOCUMENTS

| | | | |
|---|---|---|---|
| 5,614,711 A * | 3/1997 | Li et al. | 250/287 |
| 5,650,616 A | 7/1997 | Iketaki | |
| 5,654,543 A | 8/1997 | Li | |
| 5,784,424 A | 7/1998 | Fries et al. | |
| 5,872,824 A | 2/1999 | Fries et al. | |
| 6,101,971 A * | 8/2000 | Denholm et al. | 118/723 E |
| 6,137,112 A | 10/2000 | McIntyre et al. | |
| 6,222,186 B1 | 4/2001 | Li et al. | |
| 6,242,735 B1 | 6/2001 | Li et al. | |
| 6,373,052 B1 | 4/2002 | Hoyes et al. | |
| 6,956,205 B2 * | 10/2005 | Park | 250/288 |
| 6,987,264 B1 | 1/2006 | Whitehouse et al. | |
| 7,119,330 B2 | 10/2006 | Kalinitchenko | |
| 2003/0098413 A1 * | 5/2003 | Weinberger et al. | 250/288 |
| 2004/0211897 A1 * | 10/2004 | Kim et al. | 250/288 |
| 2005/0082471 A1 | 4/2005 | Kalinitchenko | |
| 2005/0230614 A1 * | 10/2005 | Glukhoy | 250/287 |
| 2007/0170994 A1 * | 7/2007 | Peggs et al. | 331/34 |
| 2007/0210248 A1 * | 9/2007 | Koo et al. | 250/287 |
| 2007/0227231 A1 * | 10/2007 | Koo et al. | 73/31.05 |
| 2007/0278397 A1 * | 12/2007 | Bateman et al. | 250/286 |
| 2008/0026133 A1 | 1/2008 | Fang et al. | |

FOREIGN PATENT DOCUMENTS

| | | |
|---|---|---|
| WO | 2004051850 A | 6/2004 |

OTHER PUBLICATIONS

Jahn, P.W., et al.; "Combined Instrument for the On-Line Investigation of Plasma Deposited or Etched Surfaces by Monochromatized X-Ray Photoelectronspectroscopy and Time-Of-Flight Secondary Ion Mass Spectrometry;" Journal of Vacuum Science and Technology: Part A, AVS/AIP, Melville, NY, vol. 12, No. 3, May 1, 1994, pp. 671-676.

Gou, F., et al.; "A New Time-of-Flight Instrument Capable of In Situ and Real-Time Studies of Plasma-Treated Surfaces," Vacuum, vol. 81, 2006, pp. 196-201.

N. Saito, et al., "Development of a Compact Time-of-Flight Mass Spectrometer with a Length of 1m for Processing Plasma Diagnostics", Jpn. J. Appl. Phys., vol. 42, p. 5306-5312, 2003.

S. Okuji, et al., "Spatial distributions of ion-species in a large-volume inductively coupled plasma source", Surface and coating Technology, vol. 136, p. 102-105, 2001.

I. G. Brown, et al., "Improved time-of-flight ion charge state diagnostic", Rev. Sci. Instrum., vol. 58, No. 9, p. 1589-1592, Sep. 1987.

J. Rosen, et al., "Charge state and time resolved plasma composition of a pulsed zircomium arc in a nitrogen environment", Journal of Applied Physics, vol. 96, No. 9, p. 4793-4799, Nov. 1, 2004.

R.M. Jordon & Co., Inc., "TOF Fundamentals," pp. 1-18, downloaded on Mar. 10, 2006 from http://www.rmjordan.com/Resources/Tutorial.pdf.

* cited by examiner

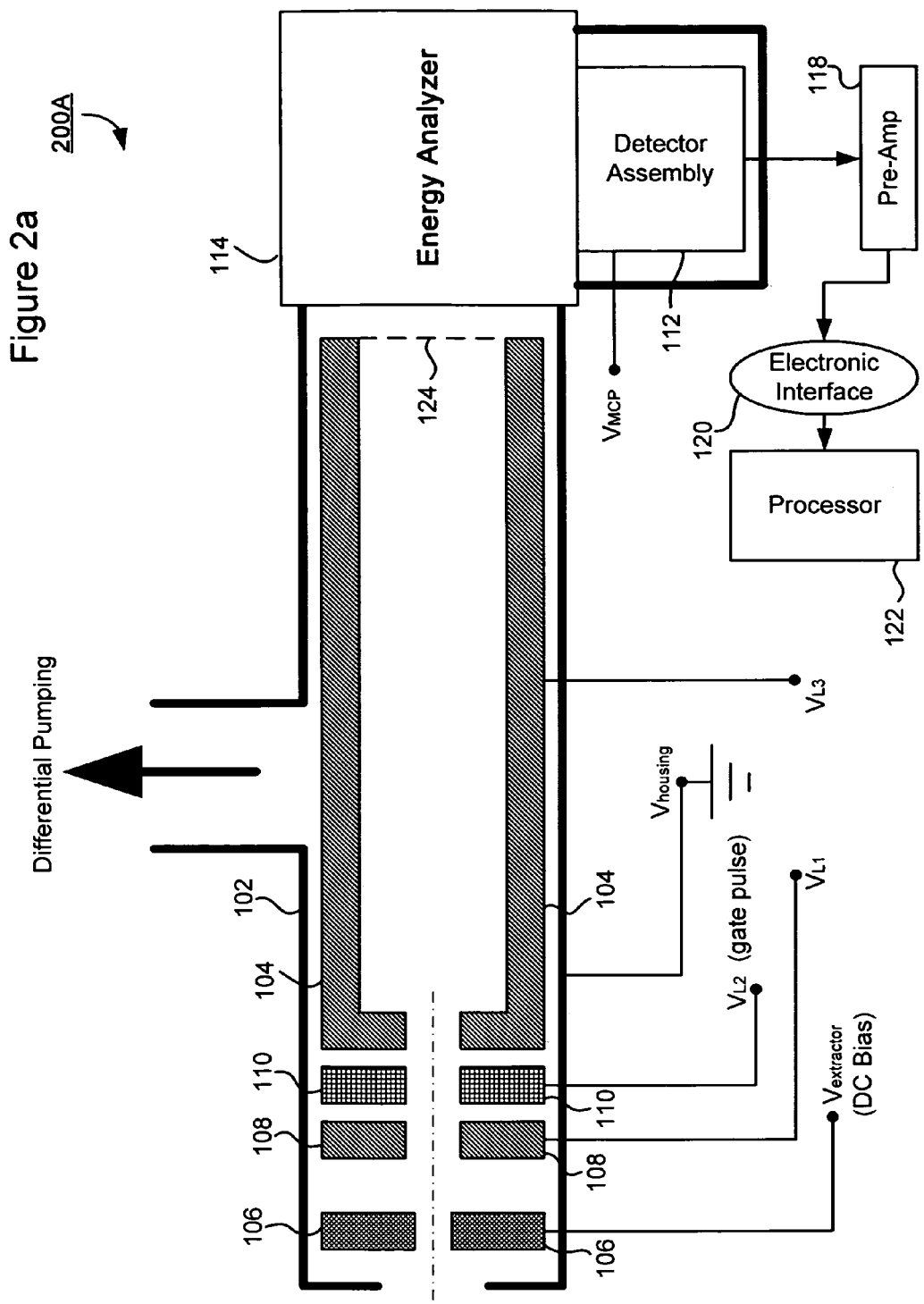

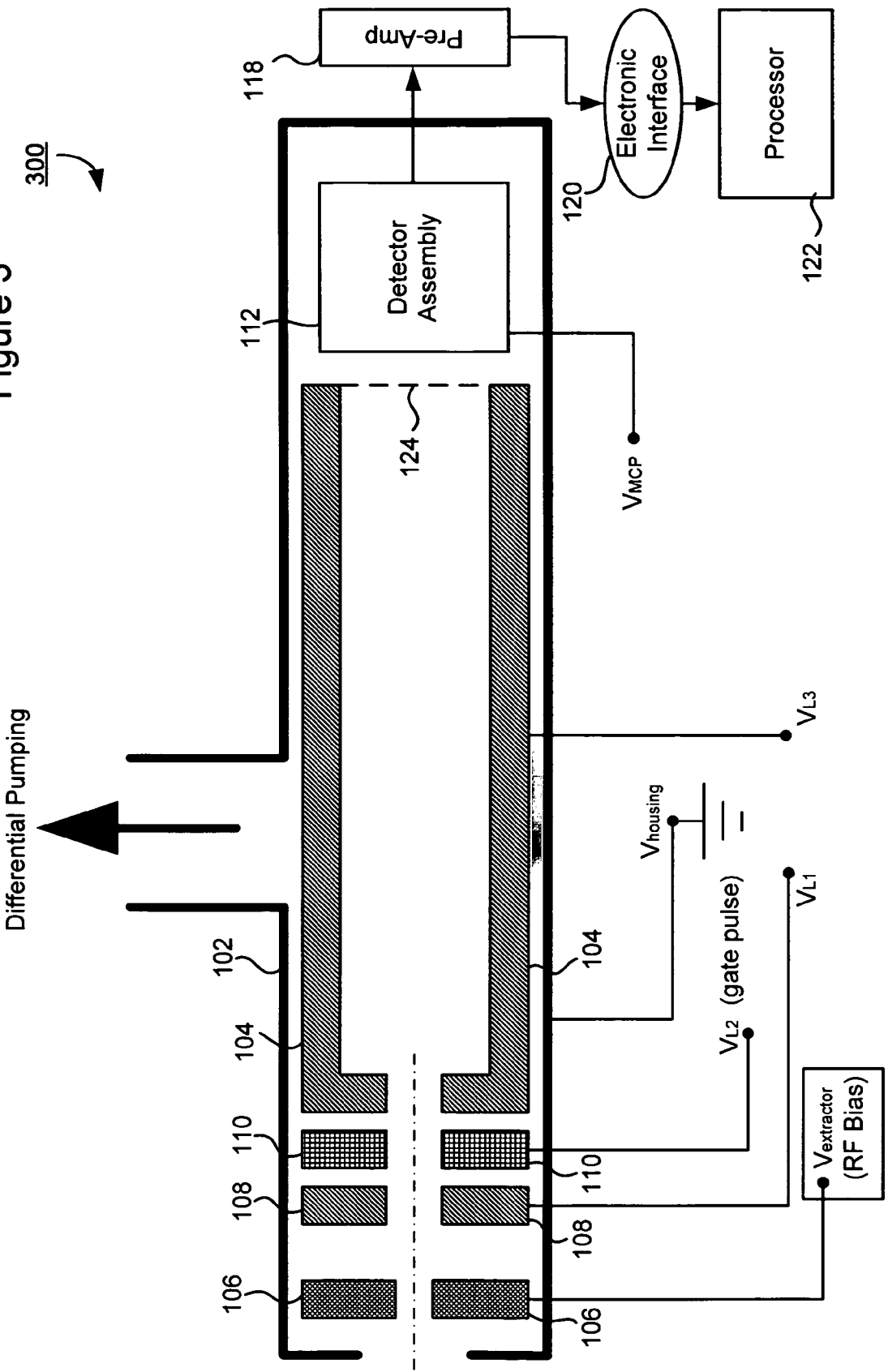

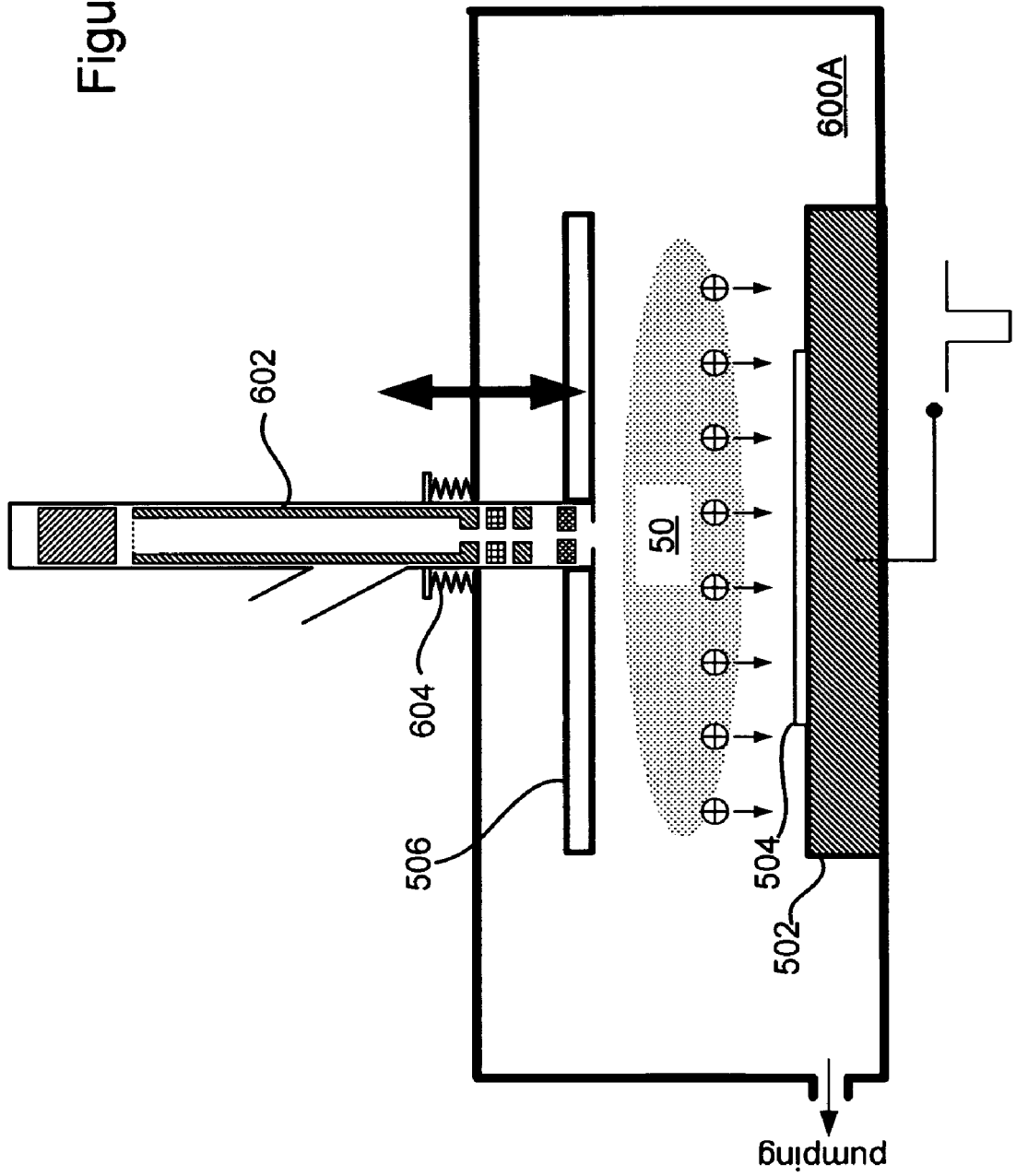

TECHNIQUE FOR MONITORING AND CONTROLLING A PLASMA PROCESS

FIELD OF THE DISCLOSURE

The present disclosure relates generally to semiconductor manufacturing equipment and, more particularly, to a technique for monitoring and controlling a plasma process.

BACKGROUND OF THE DISCLOSURE

Plasma processes are widely used in semiconductor manufacturing, for example, to implant wafers with various dopants, to deposit or to etch thin films. In order to achieve predictable and repeatable process results, it is critical to closely monitor and control the plasma characteristics. For example, studies of plasma doping (PLAD) processes have shown that ion composition of a plasma may be a critical piece of information that determines dopant species, dopant depth profiles, process-related contamination, etc. The ion composition changes with PLAD process parameters such as gas ratio, total gas pressure, and discharge power. The ion composition can also change significantly depending on the conditioning status of a plasma chamber. Therefore, it is important to know the ion composition during a PLAD process, preferably in situ and in real-time, in order to achieve repeatable and predictable process results.

Existing plasma tools often lack the capability of providing detailed real-time information (e.g., ion composition) of a plasma. In a typical PLAD process, for example, a plasma is controlled by monitoring an implant dose based on a Faraday cup current. However, a Faraday cup is just a total charge counter which does not distinguish different charged particles or otherwise offer any insight of the plasma. Although in-situ mass analysis has been employed in some traditional beamline ion implantation systems, it has typically been avoided in plasma-based ion implantation systems in order to achieve a high throughput.

In addition, conventional ion sensors, such as commercial mass/energy analyzers and quadrapole mass spectrometers, are often too bulky and/or too intrusive to implement in production tools. Large ion sensors tend to perturb a plasma under measurement and therefore distort process results. Furthermore, the size and weight of conventional ion sensors often limit their deployment options in a semiconductor process tool. Furthermore, in pulsed plasma processing wherein a plasma alternates between on and off states, time-resolved measurements of the plasma are often required. However, few existing ion sensors provide the capability of time-resolved measurements.

In view of the foregoing, it would be desirable to provide a technique for monitoring ion species which overcomes the above-described inadequacies and shortcomings.

SUMMARY OF THE DISCLOSURE

A technique for monitoring and controlling a plasma process is disclosed. In one particular exemplary embodiment, the technique may be realized as a time-of-flight ion sensor for monitoring ion species in a plasma chamber. The ion sensor may comprise a drift tube. The ion sensor may also comprise an extractor electrode and a plurality of electrostatic lenses disposed at a first end of the drift tube, wherein the extractor electrode is biased to attract ions from a plasma in the plasma chamber, and wherein the plurality of electrostatic lenses cause at least one portion of the attracted ions to enter the drift tube and drift towards a second end of the drift tube within a limited divergence angle. The ion sensor may further comprise an ion detector disposed at the second end of the drift tube, wherein the ion detector detects arrival times associated with the at least one portion of the attracted ions. The ion sensor may additionally comprise a housing for the extractor, the plurality of electrostatic lenses, the drift tube, and the ion detector, wherein the housing accommodates differential pumping between the ion sensor and the plasma chamber.

In accordance with other aspects of this particular exemplary embodiment, the extractor electrode may have an aperture between 10 and 500 microns in diameter, and wherein the plurality of electrostatic lenses have apertures substantially aligned with the extractor electrode aperture.

In accordance with further aspects of this particular exemplary embodiment, at least one of the plurality of electrostatic lenses may be provided with a voltage pulse to cause the at least one portion of the attracted ions to enter the drift tube. The voltage pulse may be synchronized with a voltage applied to a wafer in the plasma chamber. Or, the voltage pulse may be synchronized with plasma generation in the plasma chamber. Alternatively, the voltage pulse may be provided with varying delays with respect to a timing reference to achieve a time-resolved measurement of the ions. The voltage pulse may also have a width that is controlled to select ion masses.

In accordance with additional aspects of this particular exemplary embodiment, the extractor electrode may be provided with a DC bias.

In accordance with another aspect of this particular exemplary embodiment, the ion sensor may further comprise an energy analyzer positioned between the drift tube and the ion detector.

In accordance with yet another aspect of this particular exemplary embodiment, the extractor electrode may be provided with a RF bias. The RF bias may cause one or more deposited materials on the extractor electrode to be sputtered.

In accordance with still another aspect of this particular exemplary embodiment, the extractor electrode may provided with a voltage pulse to admit ions into the drift tube.

In accordance with a further aspect of this particular exemplary embodiment, the drift tube may be maintained at a same voltage potential as one of the plurality of electrostatic lenses.

In accordance with a yet further aspect of this particular exemplary embodiment, the housing may be grounded.

In accordance with a still further aspect of this particular exemplary embodiment, the ion sensor may be installed through a sidewall of the plasma chamber with the extractor electrode positioned near an edge of the plasma. Or, the ion sensor may be installed through an anode, and wherein the ion sensor is moveable with the anode to monitor the plasma. Alternatively, the plasma chamber may hold a wafer for processing in the plasma, and wherein the ion sensor may be positioned along a side of the wafer so that the ion sensor and the wafer share substantially the same vantage point with respect to the plasma. In this case, the housing may be biased at approximately the same potential as the wafer. The ion sensor may also be movable within the plasma chamber to collect ions from the plasma at two or more spatial points.

According to other embodiments, the ion sensor may further comprise an interface to a process control module that is adapted to receive data from the ion detector to provide one or more functions selected from a group consisting of: ion dose correction, dopant uniformity monitoring and control, conditioning of the plasma chamber, and fault detection in the plasma process.

In another particular exemplary embodiment, the technique may be realized as a method for monitoring ion species in a plasma. The method may comprise applying a first bias to an extractor electrode to attract ions from a plasma. The method may also comprise providing a voltage pulse to one of a series of electrostatic lenses to extract at least one portion of the attracted ions. The method may further comprise applying a combination of biases to the series of electrostatic lenses to cause the at least one portion of attracted ions to enter a first end of a drift tube and drift towards a second end of the drift tube within a limited divergence angle. The method may additionally comprise detecting, at the second end of the drift tube, arrival times associated the at least one portion of attracted ions.

In yet another particular exemplary embodiment, the technique may be realized as at least one signal embodied in at least one carrier wave for transmitting a computer program of instructions configured to be readable by at least one processor for instructing the at least one processor to execute a computer process for performing the method as recited above.

In still another particular exemplary embodiment, the technique may be realized as at least one processor readable carrier for storing a computer program of instructions configured to be readable by at least one processor for instructing the at least one processor to execute a computer process for performing the method as recited above.

In a further particular exemplary embodiment, the technique may be realized as time-of-flight ion sensor for monitoring ion species in a plasma chamber. The ion sensor may comprise a drift tube. The ion sensor may also comprise a plurality of electrostatic lenses disposed at a first end of the drift tube. The sensor may further comprise an ion detector disposed at a second end of the drift tube. The ion sensor may additionally comprise a housing for the plurality of electrostatic lenses, the drift tube, and the ion detector, wherein the housing accommodates differential pumping between the ion sensor and the plasma chamber. The housing may be biased to attract ions from a plasma in the plasma chamber. The plurality of electrostatic lenses may cause at least one portion of the attracted ions to enter the drift tube and drift towards a second end of the drift tube within a limited divergence angle. The ion detector may detect arrival times associated with the at least one portion of the attracted ions.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 2a shows an ion sensor having an energy analyzer in accordance with an embodiment of the present disclosure.

FIG. 3 shows an ion sensor having another exemplary configuration in accordance with an embodiment of the present disclosure.

FIGS. 6a-c show different examples of plasma processing chambers in accordance with embodiments of the present disclosure.

DETAILED DESCRIPTION OF EXEMPLARY EMBODIMENTS

Embodiments of the present disclosure provide a number of compact designs of time-of-flight (TOF) ion sensors that are suitable for in-situ monitoring and controlling of a plasma process. These designs may employ flexible ion extraction and ion focusing techniques to measure ion composition in a plasma chamber. Each TOF ion sensor may be installed in a variety of ways in the plasma chamber and may be configured for a number of functions such as, for example, in-situ process control, chamber readiness verification, fault detection, implant dose correction, and implant uniformity measurement. The sensitivity and size of each ion sensor may allow time-resolved measurement and spatial measurement of a plasma.

Figure 1:
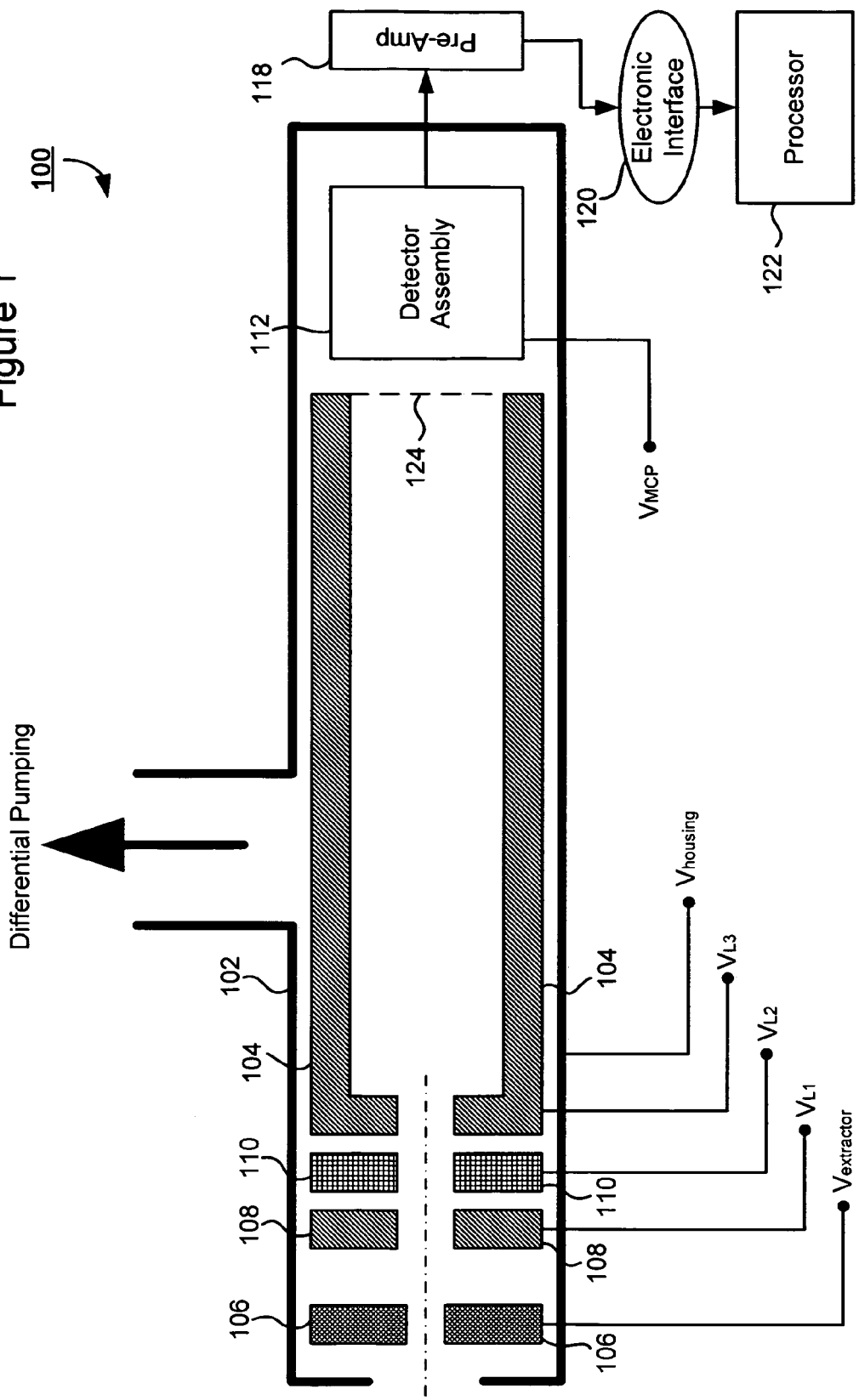
FIG. 1 shows an exemplary ion sensor in accordance with an embodiment of the present disclosure.

Referring to FIG. 1, there is shown an exemplary ion sensor 100 in accordance with an embodiment of the present disclosure. Ion sensor 100 may comprise a housing 102 that may be adapted for installation in a view port of a plasma chamber and may accommodate differential pumping. The housing 102 may be individually biased at a desired potential $V_{housing}$. A left hand side of the housing 102 may be referred to as an "extractor side" since ions extracted from a plasma enters the ion sensor 100 via an aperture ("housing aperture") on the left hand side of the housing 102. A right hand side of the housing 102 may be referred to as a "detector side" since ion detection takes place on the right hand side of the housing 102.

Ion sensor 100 may also comprise a drift tube 104 inside the housing 102 which may also be individually biased, for example, at a desired potential $V_{L3}$. The drift tube 104 may have a hollow space with a negligible electromagnetic field. An extractor side of the drift tube 104 may have an aperture ("drift tube aperture") for admitting ions. A detector side of the drift tube 104 may have a grid 124 that allows ions to exit while shielding out external electric fields. The plasma chamber's pressure is typically 1-3000 mTorr, while the drift tube is at $2 \times 10^{-6}$ Torr or less. Therefore, differential pumping is provided to accommodate the pressure difference.

On the extractor side of the drift tube 104, between the housing aperture and the drift tube aperture, there may be a series of electrodes for extracting and focusing ions. For example, there may be an extractor electrode 106 next to the housing aperture. The extractor electrode 106 may have an aperture typically between 10 and 500 microns in diameter (preferable 50-200 microns), although the actual aperture size may be varied based at least in part on the differential pumping needs. The extractor electrode 106 may be biased at a suitable potential $V_{extractor}$ to attract either positive or negative ions from a plasma. The attracted ions may be traveling at diverse angles. To ensure that the attracted ions travel towards the detector side within a finite beam angle (e.g., equal or less than +/− 1.5 degrees), two or more electrodes (e.g., electrostatic lenses 108 and 110) may be arranged in series with their apertures aligned with those of the housing 102, the extractor 106, and the drift tub 104, wherein each electrostatic lens may be individually biased to create a desired electrostatic field to keep the ions in a focused beam. The electrostatic lens 108 may be biased at $V_{L1}$ and the electrostatic lens 110 at $V_{L2}$. The drift tube 104, biased at $V_{L3}$, may function as a third electrostatic lens in the series. One of the electrostatic lenses may be provided with a voltage pulse to admit a portion (or packet) of the attracted ions into the drift tube 104. The voltage pulse may be repeated in a timed manner for a periodical or near-continuous sampling of the ions.

Once admitted into the drift tube 104, the ions may drift towards the detector end virtually unaffected by any electric field. With a same kinetic energy, heavy ions may travel slower and light ions may travel faster. Given sufficient flight time (i.e., sufficient length of the drift tube 104), the ions may become separated into individual packets based on ion mass of each ion species.

On the detector side, a detector assembly 112 may be used to detect the ions. The detector assembly 112 may be any type of commercially available or customized ion detection device (e.g., micro-channel plate (MCP) assembly). Detection and/or collection of the ions may be controlled, for example, with one or more voltage biases such as $V_{MCP}$. The detector assembly 112 may be coupled to a pre-amplifier 118 that is in turn coupled to a processor unit 122 via an electronic interface 120. The electronic interface 120 may be, for example, a fast data acquisition card, and the processor unit 122 may be, for example, a personal computer (PC) or other types of computing device. The individual packets, having distinct ion mass numbers, may be detected sequentially, and corresponding signals may be amplified by the pre-amplifier 118. When the signals are processed in the processor unit 122, signals corresponding to each individual packet may produce a mass peak in a mass spectrum. Based on one or more samplings of ion species from a plasma, the mass spectrum may accurately reflect an ion composition of the plasma.

Figure 4:
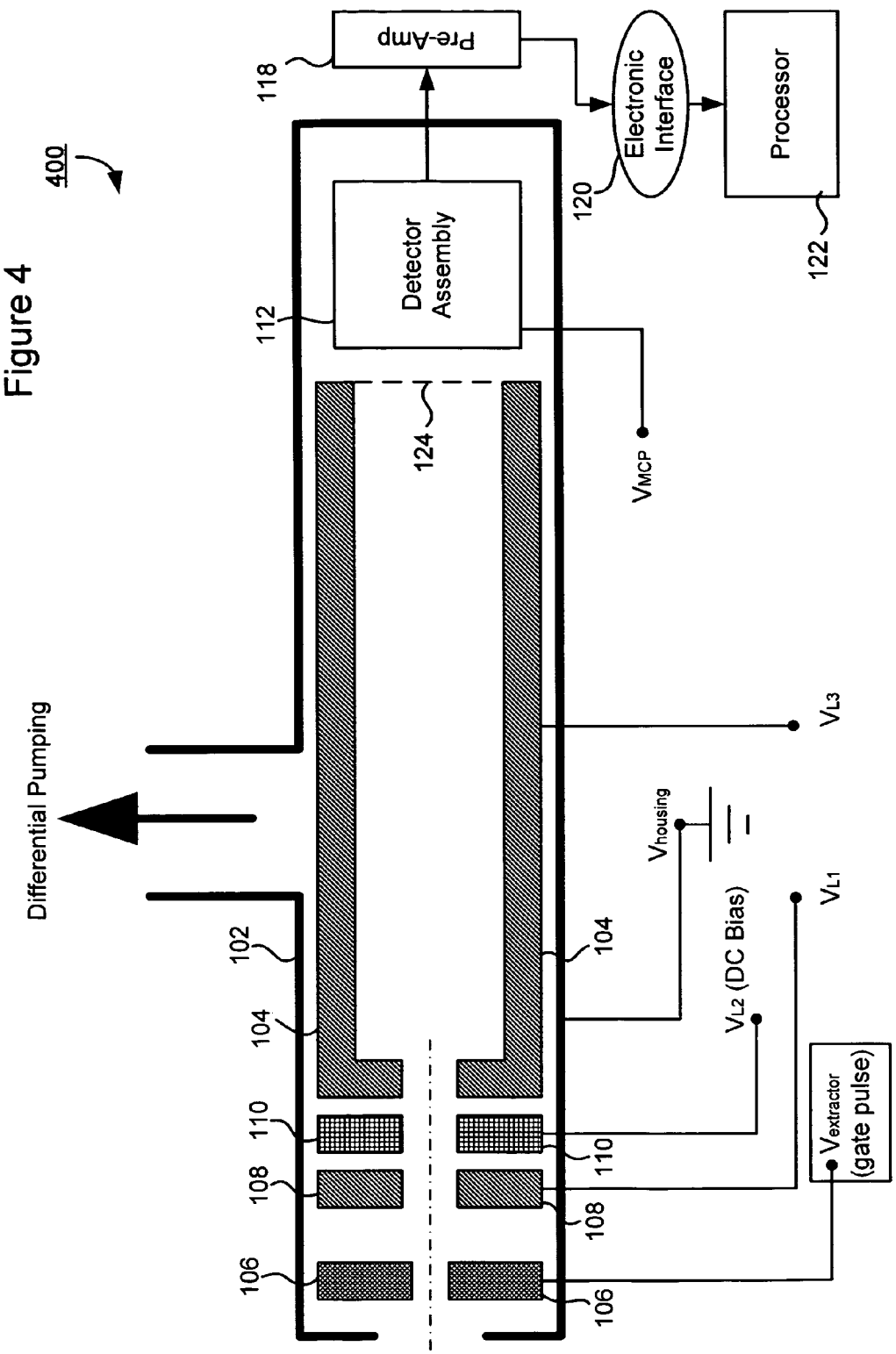
FIG. 4 shows an ion sensor having yet another exemplary configuration in accordance with an embodiment of the present disclosure.

According to embodiments of the present disclosure, the ion sensor 100 may be flexibly configured by applying different combinations of voltage potentials to the housing 102, the drift tube 104, the extractor electrode 106, the electrostatic lenses 108 and 110, and the detector assembly 112. Exemplary configurations are shown in FIGS. 2-4.

Figure 2:
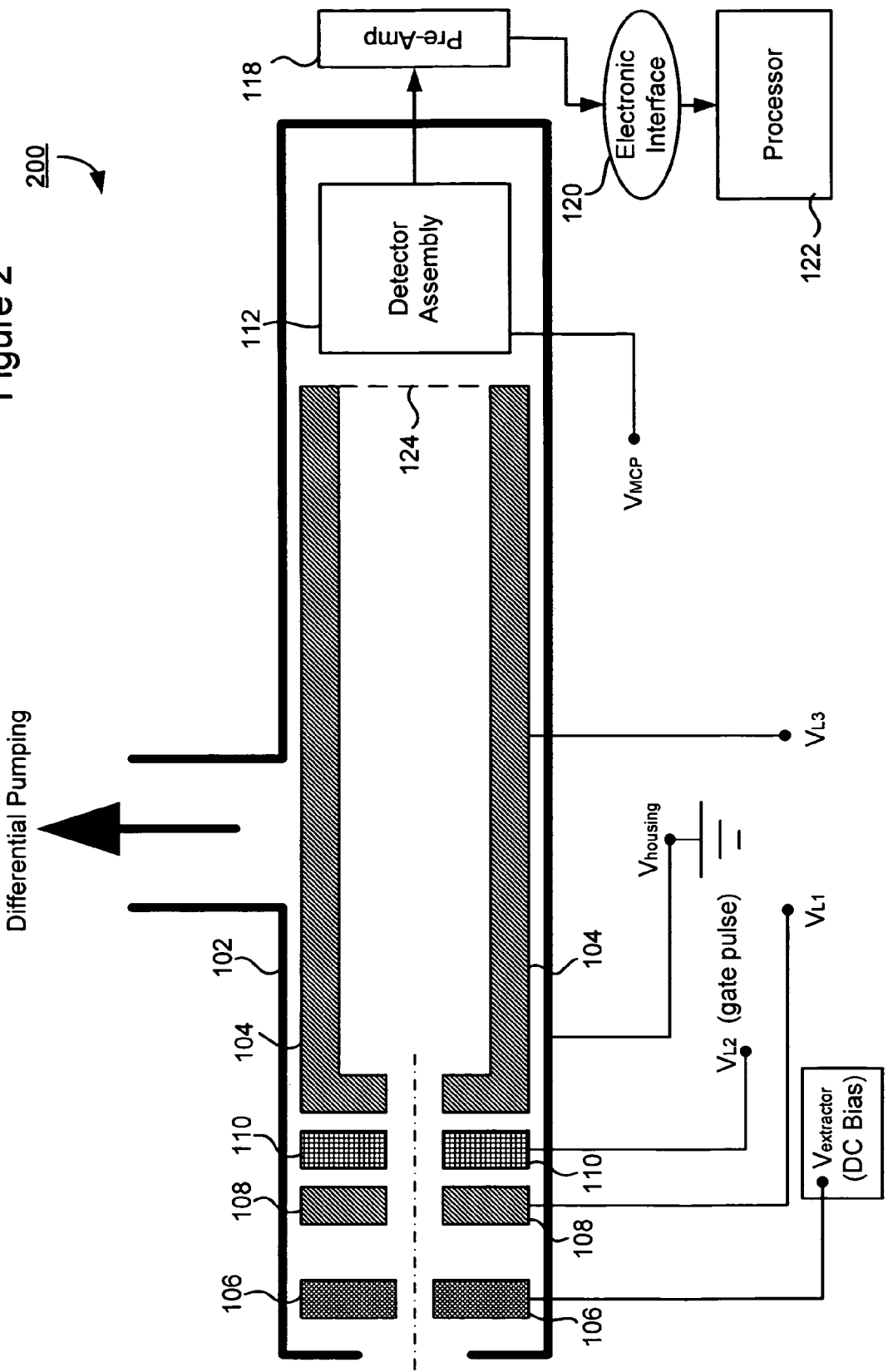
FIG. 2 shows an ion sensor having one exemplary configuration in accordance with an embodiment of the present disclosure.

FIG. 2 shows an ion sensor 200 having one exemplary configuration in accordance with an embodiment of the present disclosure. The ion sensor 200 may comprise substantially the same components as the ion sensor 100 shown in FIG. 1. In this exemplary configuration, the housing 104 may be grounded and/or attached to a plasma chamber wall. The extractor electrode 106 may be biased at $V_{extractor} \approx -50V\text{-}0V$ DC for extraction of positive ions or $V_{extractor} \approx 0V\text{-}50V$ DC for extraction of negative ions. For illustration purposes, the description below will assume that only positive ions are sampled. It should be noted, however, that embodiments of the present disclosure can be easily adapted or configured for sampling of negative ions. Further, for simplicity, the electrostatic lens 108 is referred to as Lens 1, the electrostatic lens 110 is referred to as Lens 2, and the drift tube 104 is referred to as Lens 3. Lens 1 and Lens 3 may be held at a same or similar potential which may be a fixed value between, for example, −150V and −300V, mainly determined by the length of the drift tube 104 and the desired ion mass resolution. In some embodiments, Lens 1 and Lens 3 may be biased at different potentials (e.g., $V_{L1}=-400V\text{--}200V$ and $V_{L3}=-200V$). Lens 2 may be biased at $V_{L2}=-500V\text{--}900V$. Lens 2 may be further configured as a "gate" for the drift tube 104. To open the gate, a short voltage pulse (e.g., 50-500 nanosecond) may be provided to Lens 2 to admit a packet of ions into the drift tube 104. To close the gate, a relatively large positive potential may be imposed on Lens 2 to block positive ions from entering the drift tube 104. According to one embodiment, Lens 2 (i.e., gate electrode) may be normally biased with a positive voltage, e.g. +30V or above, except during the very short gating period. For example, assume that the gate pulse width is 100 ns, and the wafer's pulse frequency is 5000 kHz (period=200 microsecond). Assuming that we sample once per wafer pulse, then in 99.95% of the period (199.9 microsecond) the gate electrode is closed and in only 0.05% of the period is the gate electrode open. When the gate pulse is synchronized with the wafer pulse, a delay may be introduced to control where the gate is open relative to the wafer pulse. In this way, it is possible to sample the plasma at different points in time space with a high resolution. The collective effect of the biases on Lenses 1-3 may be an electrostatic field that focuses the admitted ions into a beam with a limited divergence angle. On the detector side, the detector assembly 112 may be biased at a high voltage $V_{MCP}$. The grid 124 may electrostatically shield the drift tube 104 from the high voltage $V_{MCP}$.

The ion sensor 200 may also be configured for time-resolved measurements of a plasma. Many semiconductor processing plasmas are "pulsed plasmas" which alternate between on and off (afterglow) states periodically. The plasma-on state may last 1-50% of each cycle. The pulsed operation can cause dynamic changes in plasma conditions and process chemistries. The sampling of the ion species may be synchronized with either the plasma pulses or wafer bias pulse, or both if they are synchronized. By changing the gate delay relative to the reference pulse (plasma pulses and/or wafer bias), time-resolved measurement could be carried out over the whole period.

FIG. 2a shows an ion sensor 200A having an energy analyzer 114 in accordance with an embodiment of the present disclosure. The energy analyzer 114 is positioned between the drift tube 104 and the detector assembly 112, for example, to select ions within a desired energy range.

FIG. 3 shows an ion sensor 300 having another exemplary configuration in accordance with an embodiment of the present disclosure. The ion sensor 300 may comprise substantially the same components as the ion sensor 100 shown in FIG. 1. In this exemplary configuration, the main difference from what is shown in FIG. 2 is that the extractor electrode 106 may be provided with a radio frequency (RF) (1-300 MHz, typically 13.56 MHz) bias. The RF biased extractor electrode 106 may serve dual functions—extracting ions and removing deposits from the extractor aperture—in a deposition-dominant environment. Many semiconductor manufacturing processes are carried out in a deposition-dominant environment wherein thin-film materials are deposited in a plasma chamber. If a thick insulating film blocks the extractor aperture, a DC bias on the extractor electrode 106 may no longer be effective. An RF bias may help sputter clean the extractor aperture to remove the deposited materials. That is, an RF bias may provide the ion sensor 300 with a "self-cleaning" capability. For ion extraction, the RF bias may have a negative average potential (or RF self-bias) between −50V and 0V, and a peak-to-peak value of 0V-100V. For sputter cleaning purposes, the RF self-bias may be larger than a sputtering threshold and the peak-to-peak value may be 100-1000V or higher.

FIG. 4 shows an ion sensor 400 having yet another exemplary configuration in accordance with an embodiment of the present disclosure. The ion sensor 400 may comprise substantially the same components as the ion sensor 100 shown in FIG. 1. Compared to FIG. 1, the main difference in this exemplary configuration is that the extractor electrode 106 now functions also as a gate. A gate pulse may be provided to the extractor electrode 106 to pull a packet of ions into the ion sensor 400. Lens 2 may be provided with a DC bias to focus the ion beam.

Ion sensors in accordance with embodiments of the present disclosure may be installed in a number of ways for flexible detection of ion species in a plasma chamber. Exemplary installation options are shown in FIGS. 5-7.

Figure 5:
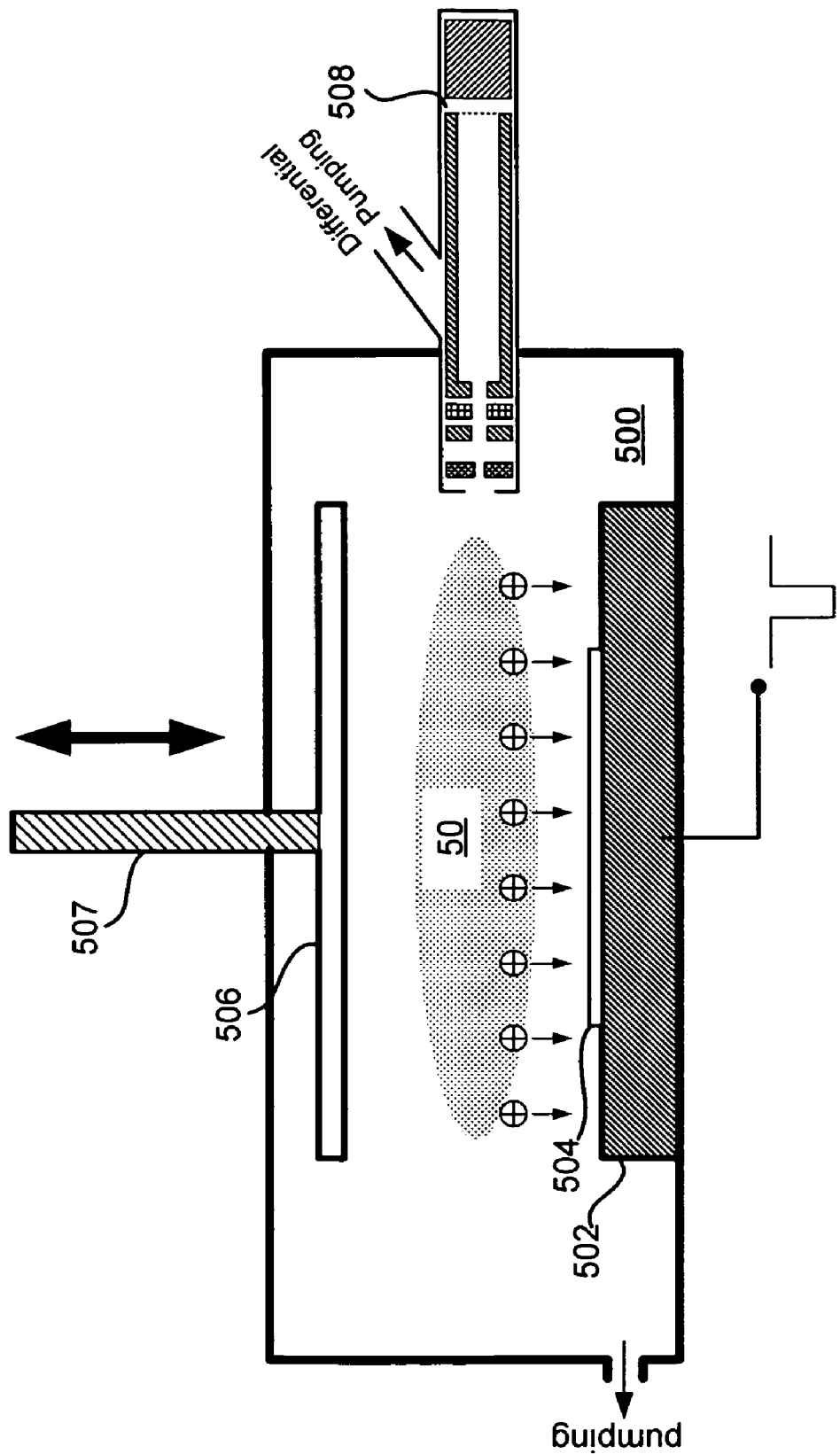
FIG. 5 shows one installation option for an ion sensor in accordance with an embodiment of the present disclosure.

FIG. 5 shows one installation option for an ion sensor 508 in accordance with an embodiment of the present disclosure. An over-simplified plasma chamber 500 is shown with a platen/cathode 502 holding a wafer 504. An anode 506 is positioned above the platen/cathode 502. The anode 506 is not necessarily grounded but may be biased at a voltage, for example, between −1 kV and +1 kV (other voltages are possible). An anode shaft 507 may enable movement of the anode 506 in the vertical direction. A plasma 50 may be generated between the anode 506 and the platen/cathode 502, either by cathode bias voltages or by additional plasma sources. For ion implantation purpose, negative voltage pulses may be applied to the platen 502 to draw positive ions towards the wafer 504. For negative ions, positive voltage pulses may be used. The ion sensor 508 may be installed in a sidewall of the plasma chamber 500. The installation may be through a view port or similar mechanism. The ion sensor 508 may have its extractor tip extended sideway into or near an edge of the plasma 50. Due to the small size of the extractor tip, it may be inserted deep into the plasma 50 without significantly disturbing the plasma 50.

Figure 6:
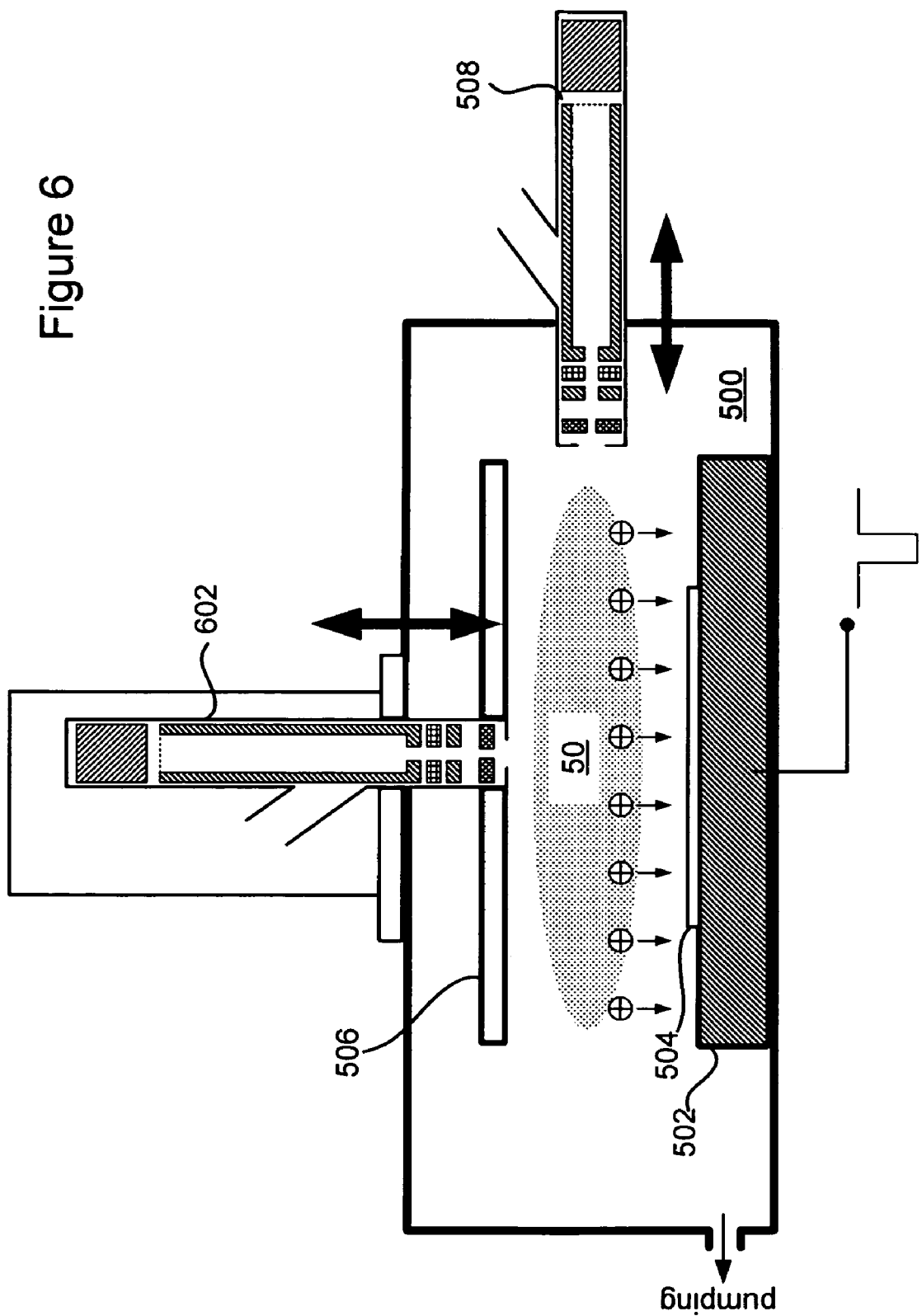
FIG. 6 shows another installation option for an ion sensor in accordance with an embodiment of the present disclosure.
Figure 7:
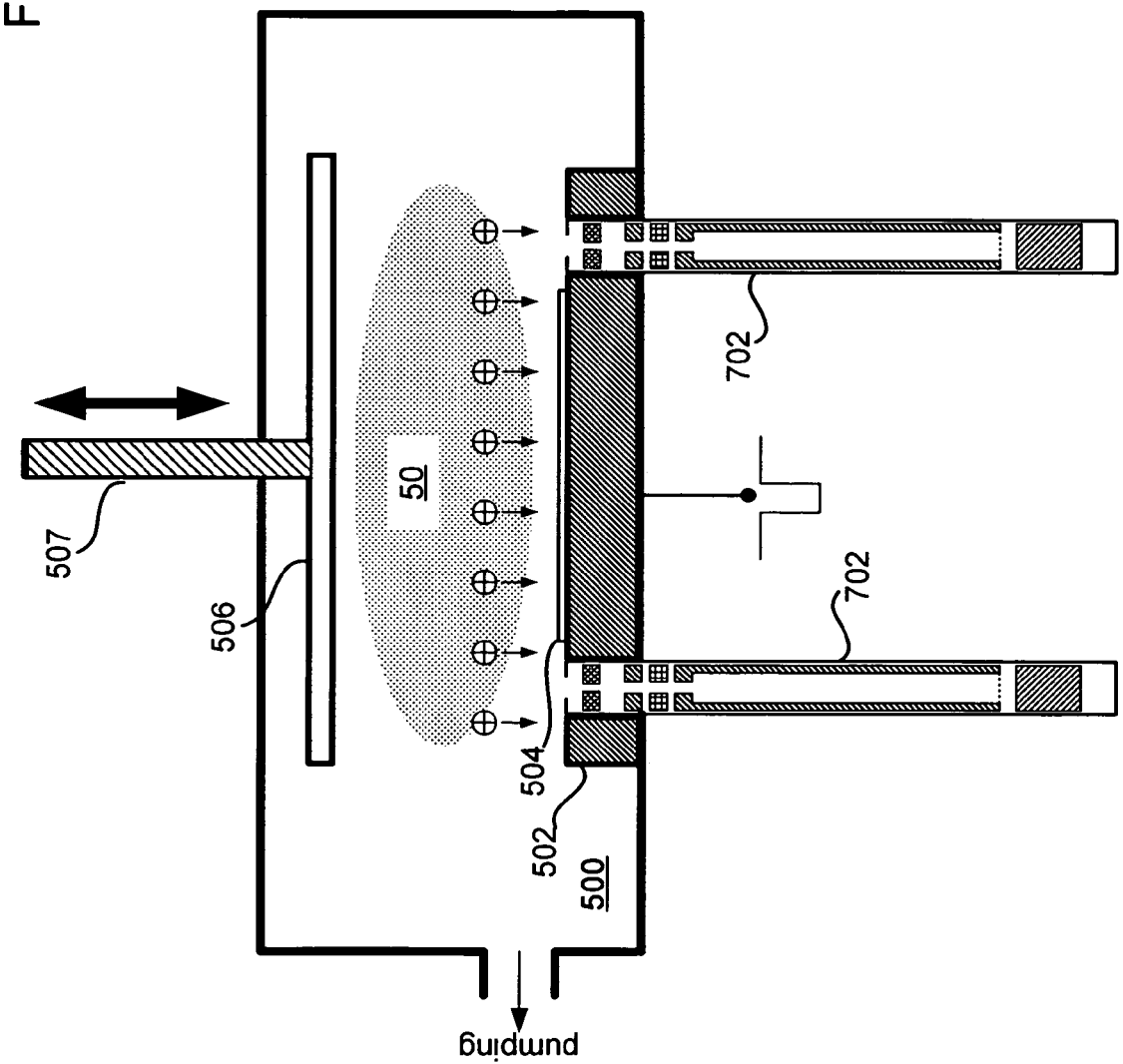
FIG. 7 shows yet another installation option for an ion sensor in accordance with an embodiment of the present disclosure.

FIG. 6 shows another installation option for an ion sensor in accordance with an embodiment of the present disclosure. In this installation option, instead of or in addition to the ion sensor 508 installed in the sidewall, an ion sensor 602 may be installed on the anode side. That is, the ion sensor 602 may be positioned through the anode 506 and be vertically oriented with its extractor tip pointing downwards at or into the plasma 50. The ion sensor 602 may be electrically connected with the anode 506. The ion sensor 602 or its extractor tip may move up and down independent from the anode 506 to sample ions at different spatial points in the plasma chamber 500. Alternatively, the ion sensor 602 or its extractor tip may move up and down together with the anode 506 for in-situ diagnostic of different process conditions. The horizontally positioned ion sensor 508 may be similarly actuated for a spatial measurement of the plasma 50.

Figure 6B:
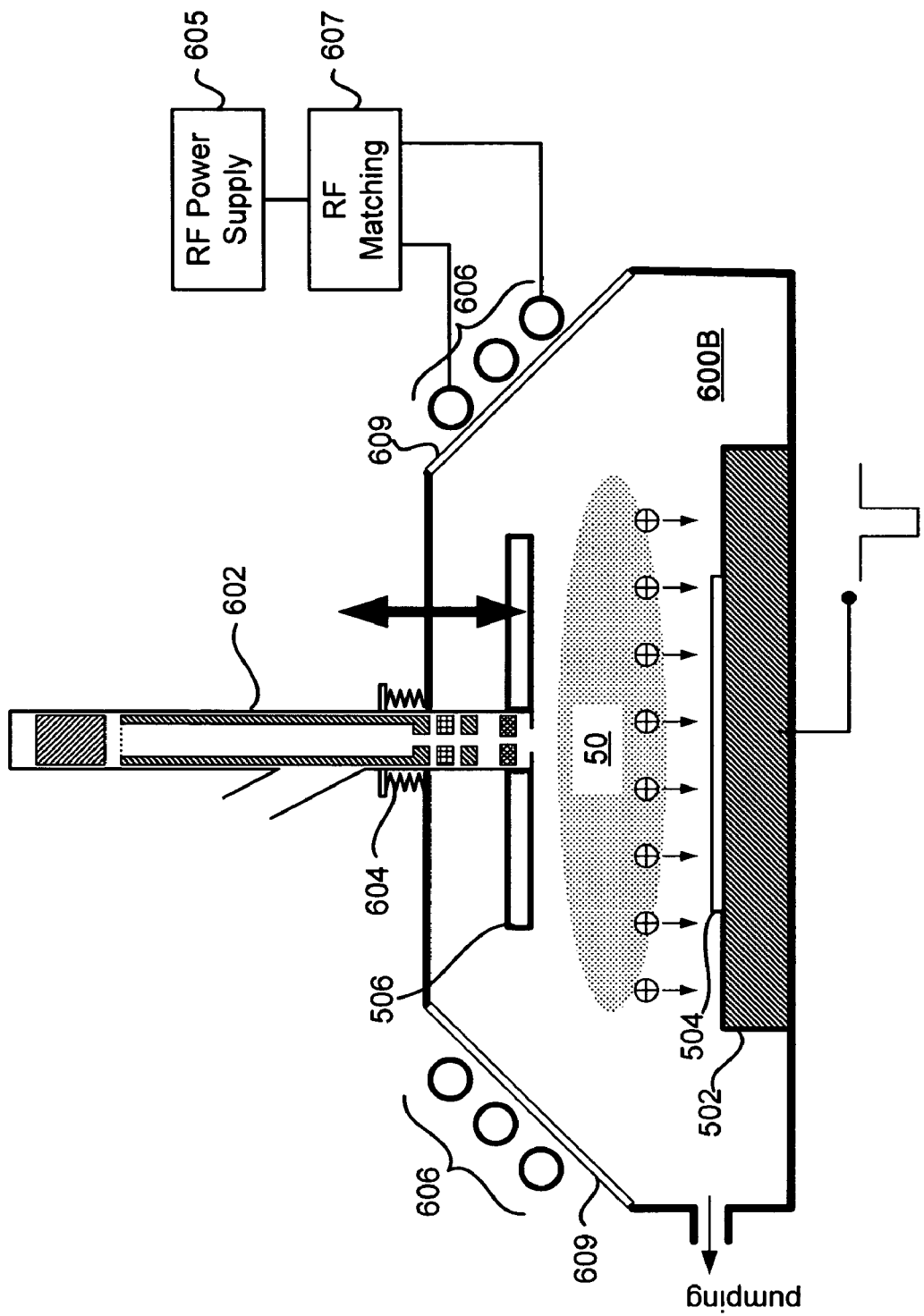
Figure 6C:
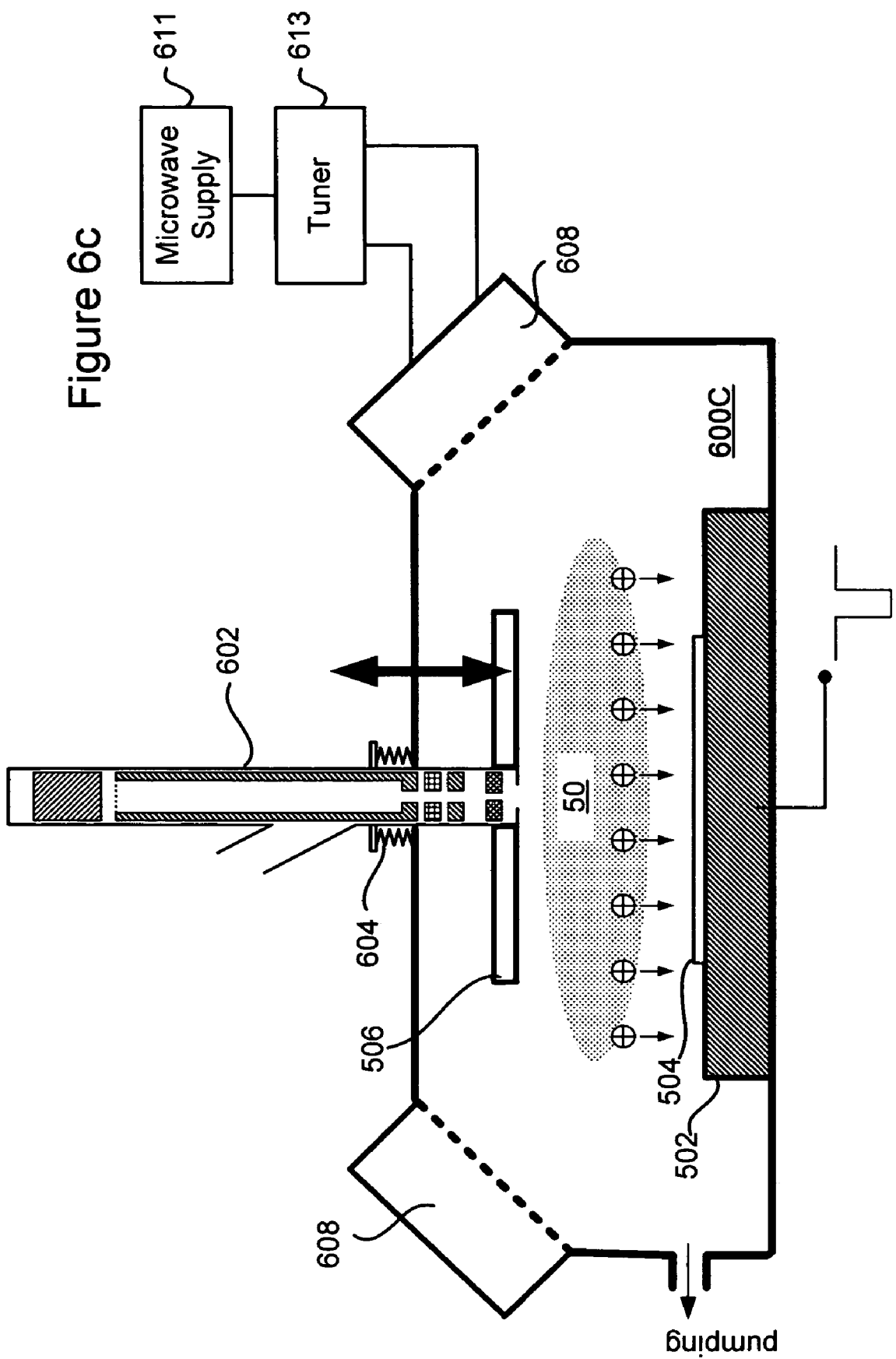

FIGS. 6a-c show different examples of plasma processing chambers in accordance with embodiments of the present disclosure.

In FIG. 6a, there is shown a plasma chamber 600A. An ion sensor 602 may be installed through an anode 506. A bellows seal 604 may accommodate installation and movement of the ion sensor 602 through the chamber wall. The plasma 50 may be generated by negatively pulsed voltages applied on the wafer 504 or the platen 502. According to one embodiment, extraction of ions from the plasma 50 into the ion sensor 602 may be synchronized with the plasma generation, and therefore the voltage pulses on the wafer 504.

In FIG. 6b, there is shown a plasma chamber 600B. A main difference between the plasma chamber 600B and the plasma chamber 600A is the plasma generation technique. The plasma chamber 600B may have one or more external plasma sources, such as, for example, ICP or Helicon plasma sources. For example, an RF power supply 605 and an RF matching unit 607 may be coupled to RF coils 606. Through dielectric interfaces 609, the RF coils 606 may supply RF electrical power into the plasma chamber 600B. The platen 502 may be biased to control the energy of ions that impact the wafer 504.

In FIG. 6c, there is shown a plasma chamber 600C, wherein another plasma generation technique is employed. One or more microwave sources may be coupled to the plasma chamber 600C to supply the power to generate and sustain the plasma 50. For example, a microwave supply 611 may be coupled to a microwave cavity 608 via a tuner 613 and a waveguide or cable. The microwave power supplied to the microwave cavity 608 may generate a "source plasma" therein, whereupon the source plasma may diffuse into the plasma chamber 600C to produce the plasma 50. Alternatively, the plasma 50 may be generated directly inside the plasma chamber 600C by coupling microwave power via the cavity 608 and into the plasma chamber 600C.

FIG. 7 shows yet another installation option for an ion sensor in accordance with an embodiment of the present disclosure. In this installation option, one or more ion sensors 702 may be installed on the cathode side. That is, an ion sensor 702 may be positioned vertically through the platen/cathode 502 with the extractor tip positioned next to the wafer 504. The installation location for the ion sensor 702 may be (or near) where a Faraday cup would be typically located. Since the extractor tip is pointing up at the plasma 50, the ion sensor 702 and the wafer 504 may share a same or similar vantage point with respect to the plasma 50. As a result, the ion sensor 702 may "see" the same composition and dose of ions as what the wafer 504 sees, which may facilitate a more accurate control of plasma processing of the wafer 504. In a plasma doping (PLAD) system, for example, the ion sensor 702 may be able to directly detect what ions are implanted into the wafer 504. If desired, the ion sensor 702 may also be moved up and down for a spatial measurement.

Figure 7A:
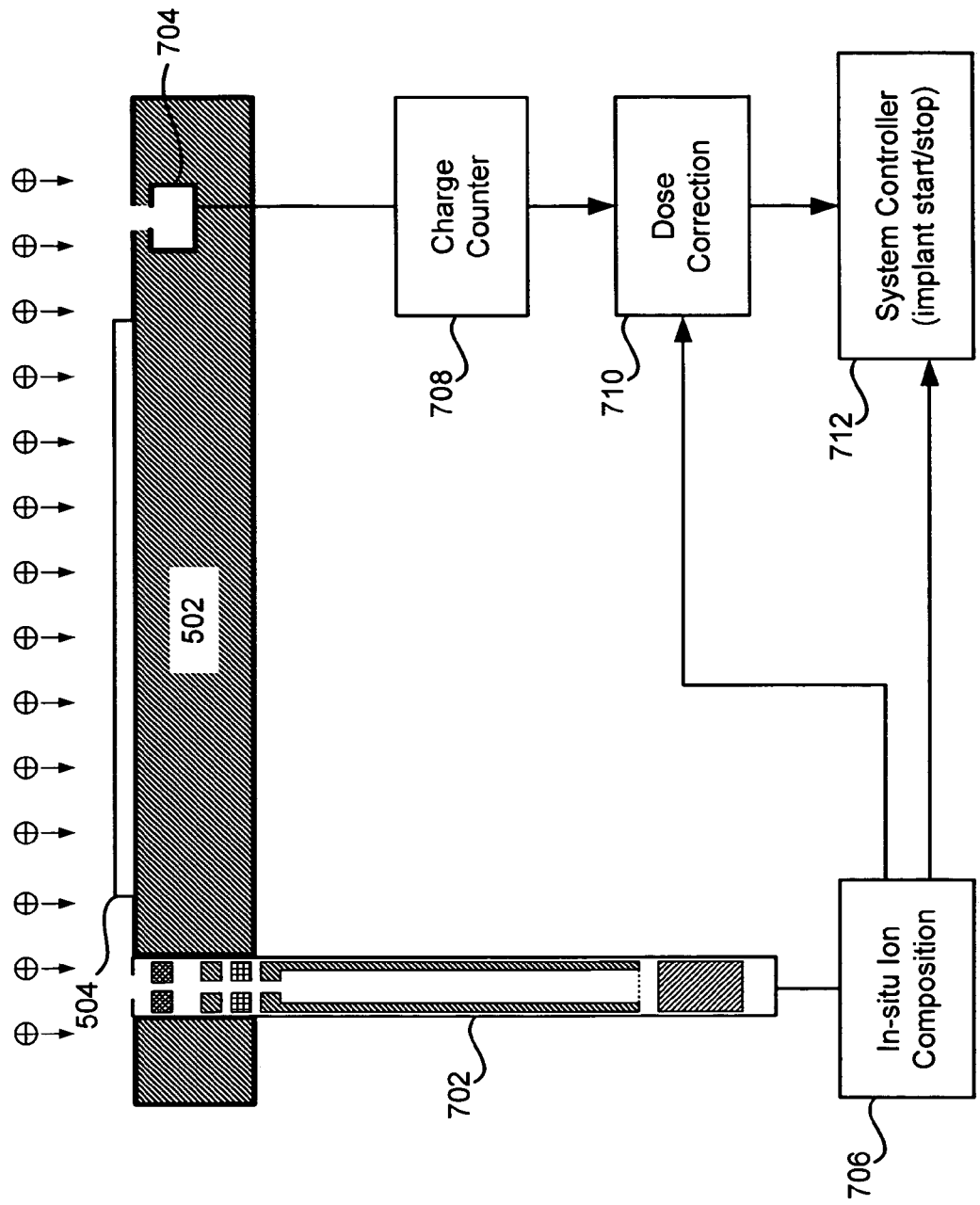
FIGS. 7a-b show exemplary systems for employing ion sensors for process control in accordance with embodiments of the present disclosure.
Figure 7B:
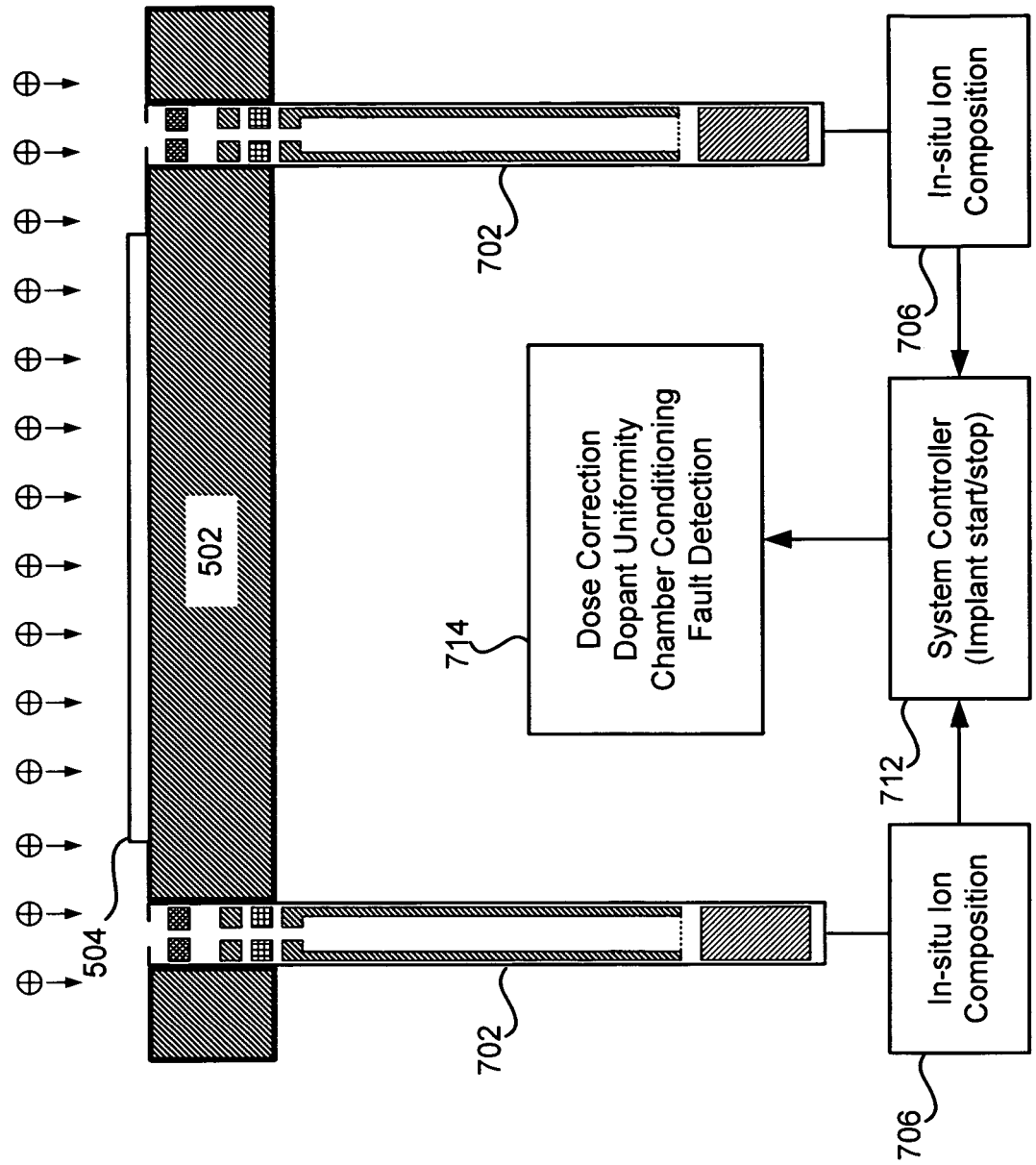

FIGS. 7a-b show exemplary systems for employing ion sensors for process control in accordance with embodiments of the present disclosure.

FIG. 7a shows an ion sensor 702 being installed next to the wafer 504. A Faraday cup 704 may be installed on the other side of the wafer 504 or the Faraday cup 704 may partially surround the wafer 504. Both the ion sensor 702 and the Faraday cup 704 face up to a plasma (not shown) as the wafer 504. The ion sensor 702 may be coupled to a unit 706 that calculates an in-situ ion composition based on detection data received from the ion sensor 702. The Faraday cup 704 may be coupled to a charge counter 708 that calculates a total ion dose based on the Faraday cup current. The ion composition information and the ion dose data may be input to a dose correction module 710. In addition, the ion composition data may be input to a system controller 712 for further process control.

FIG. 7b shows two or more ion sensors 702 being installed around the wafer 504. The in-situ ion composition data from these ion sensors 702 may be input to the system controller 712. Output functions 714 of the system controller 712 may include, but are not limited to, ion dose correction, dose uniformity control, plasma chamber conditioning, and/or process fault detection.

For the cathode-side (or wafer-side) measurement of the plasma 50, the ion sensor 702 may be configured differently from those shown in FIGS. 2-4. One example is shown in FIG. 8.

Figure 8:
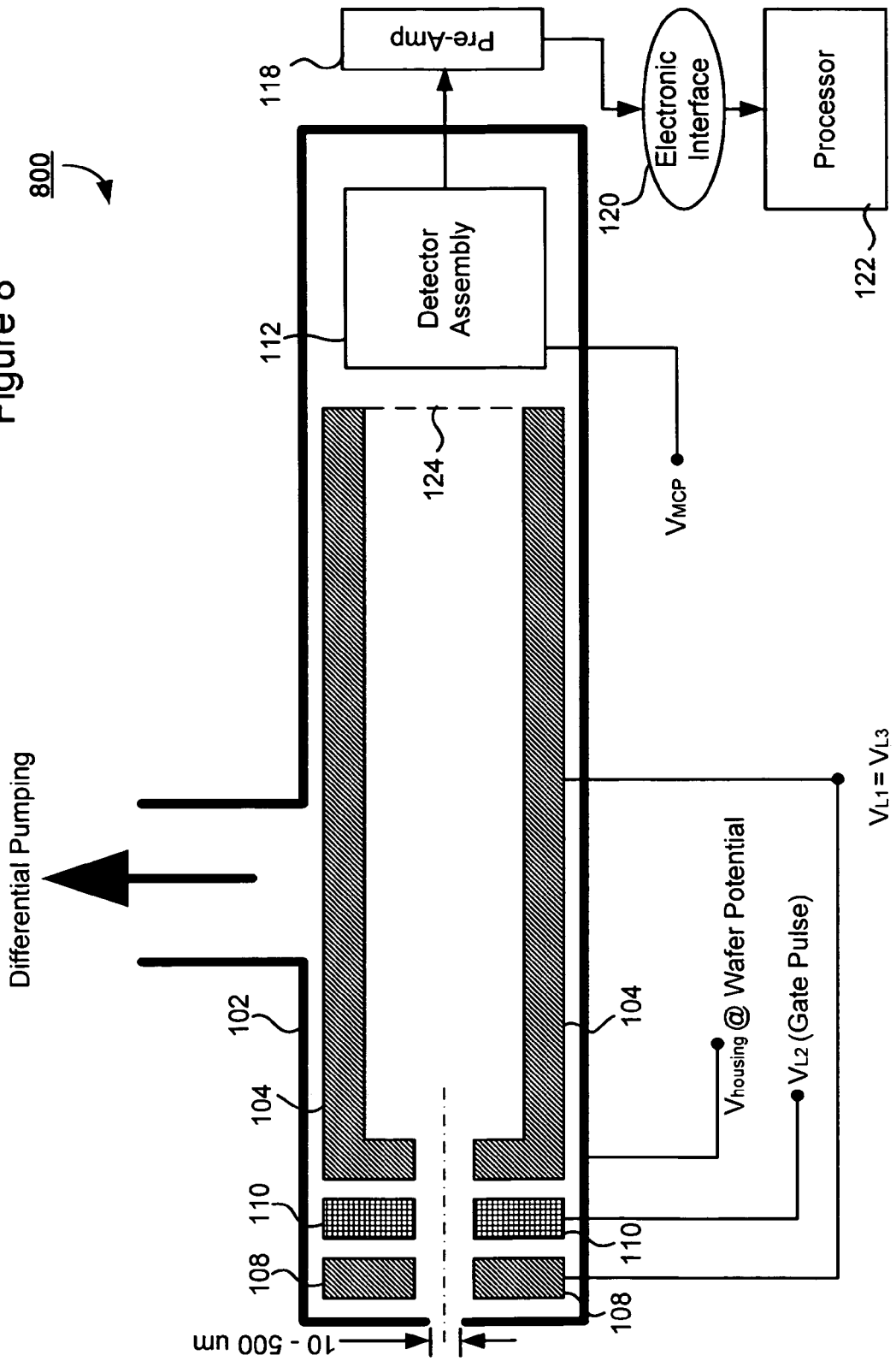
FIG. 8 shows an exemplary ion sensor in accordance with an embodiment of the present disclosure.

FIG. 8 shows an exemplary ion sensor 800 in accordance with an embodiment of the present disclosure. The ion sensor 800 may comprise substantially the same components as the ion sensor 200 shown in FIG. 2, except that the extractor electrode 106 is removed. The housing aperture at the extractor side may be shrunk to approximately 10-500 microns (preferably 50-200 microns). The housing 102 may be biased at a same or similar potential (e.g., 0V--10 kV) as the wafer 504. Lens 1, Lens 3 (drift tube 104), and detector assembly 112 may also be biased at a same or similar potential. Lens 2 may function as a gate to pulse ion packets into the drift tube 104.

At this point it should be noted that the ion sensors in accordance with the present disclosure as described above typically involves the processing of input data and the generation of output data to some extent. This input data processing and output data generation may be implemented in hardware or software. For example, specific electronic components may be employed in a plasma processing tool or similar or related circuitry for implementing the functions associated with in-situ monitoring of ion species in accordance with the present disclosure as described above. Alternatively, one or more processors operating in accordance with stored instructions may implement the functions associated with in-situ monitoring of ion species in accordance with the present disclosure as described above. If such is the case, it is within the scope of the present disclosure that such instructions may be stored on one or more processor readable carriers (e.g., a magnetic disk), or transmitted to one or more processors via one or more signals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A time-of-flight ion sensor for monitoring ion species in a plasma chamber, comprising:
a drift tube;
an extractor electrode and a plurality of electrostatic lenses disposed at a first end of the drift tube, wherein the extractor electrode is biased to attract ions from a plasma in the plasma chamber, and wherein the plurality of electrostatic lenses cause at least one portion of the attracted ions to enter the drift tube and drift towards a second end of the drift tube within a limited divergence angle;
an ion detector disposed at the second end of the drift tube, wherein the ion detector detects arrival times associated with the at least one portion of the attracted ions; and
a housing for the extractor, the plurality of electrostatic lenses, the drift tube, and the ion detector, wherein the housing accommodates differential pumping between the ion sensor and the plasma chamber,
wherein the plasma chamber holds a wafer for processing in the plasma, wherein the ion sensor as positioned along a side of the wafer so that the ion sensor and the wafer share substantially the same vantage point with respect to the plasma, and the wherein the housing is biased at approximately the same potential as the wafer.

2. The ion sensor according to claim 1, wherein the extractor electrode has an aperture between 10 and 500 microns in diameter, and wherein the plurality of electrostatic lenses have apertures substantially aligned with the extractor electrode aperture.

3. The ion sensor according to claim 1, wherein at least one of the plurality of electrostatic lenses is provided with a voltage pulse to cause the at least one portion of the attracted ions to enter the drift tube.

4. The ion sensor according to claim 3, wherein the voltage pulse is synchronized with a voltage applied to a wafer in the plasma chamber.

5. The ion sensor according to claim 3, wherein the voltage pulse is synchronized with plasma generation in the plasma chanter.

6. The ion sensor according to claim 3, wherein the voltage pulse is provided with varying delays with respect to a timing reference to achieve a time-resolved measurement of the ions.

7. The ion sensor according to claim 3, wherein the voltage pulse has a width that is controlled to select ion masses.

8. The ion sensor according to claim 1, wherein the extractor electrode is provided with a DC bias.

9. The ion sensor according to claim 1, further comprising:
an energy analyzer positioned between the drift tube and the ion detector.

10. The ion sensor according to claim 1, wherein the extractor electrode is provided with a RF bias.

11. The ion sensor according to claim 10, wherein the RF bias causes one or more deposited materials on the extractor electrode to be sputtered.

12. The ion sensor according to claim 1, wherein the extractor electrode is provided with a voltage pulse to admit ions into the drift tube.

13. The ion sensor according to claim 1, wherein the drift tube is maintained at a same voltage potential as one of the plurality of electrostatic lenses.

14. The ion sensor according to claim 1, wherein the housing is grounded.

15. The ion sensor according to claim 1, wherein the ion sensor is installed through a wall of the plasma chamber with the extractor electrode positioned near an edge of the plasma.

16. The ion sensor according to claim 1, further comprising an interface to a process control module that is adapted to receive data from the ion detector to provide one or more functions selected from a group consisting of: ion dose correction, dopant uniformity monitoring and control, conditioning of the plasma chamber, and fault detection in the plasma process.

17. A method for monitoring a plasma contained in a plasma chamber for processing substrate, the method comprising the steps of:

applying a first bias to an extractor electrode of a time-of-flight (TOF) ion sensor to attract ions from a plasma, the TOF ion sensor being proximate and movable within the plasma chamber to collect ions from the plasma at two or more spatial points;

providing a voltage pulse to one of a series of electrostatic lenses of the TOF ion sensor to extract at least one portion of the attracted ions;

applying a combination of biases to the series of electrostatic lenses to cause the at least one portion of attracted ions to enter a first end of a drift tube of the TOF ion sensor and drift towards a second end of the drift tube within a limited divergence angle; and detecting, at the second end of the drift tube, arrival times associated the at least one portion of attracted ions.

18. A time-of-flight ion sensor for monitoring ion species in a plasma chamber, comprising:

a drift tube;

a plurality of electrostatic lenses disposed at a first end of the drift tube;

an ion detector disposed at a second end of the drift tube; and a housing for the plurality of electrostatic lenses, the drift tube, and the ion detector, the housing accommodating differential pumping between the ion sensor and the plasma chamber, the housing being biased to attract ions from a plasma in the plasma chamber, wherein the plasma chamber holds a wafer for processing in the plasma, and wherein the ion sensor is positioned along a side of the wafer so that the ion sensor and the wafer share substantially the same vantage point with respect to the plasma, wherein the plurality of electrostatic lenses cause at least one portion of the attracted ions to enter the drift tube and drift towards a second end of the drift tube within a limited divergence angle, and wherein the ion detector detects arrival times associated with the at least one portion of the attracted ions.

19. The plasma chamber according to claim 1, wherein the plasma includes a plasma edge, and wherein the time-of-flight ion sensor is proximate to the plasma edge.

20. The plasma chamber according to claim 17, wherein the plasma includes a plasma edge, and wherein the time-of-flight ion sensor is disposed proximate to the plasma edge.

21. The plasma chamber according to claim 20, wherein the plasma includes a plasma edge, and wherein the time-of-flight ion sensor is disposed proximate to the plasma edge.

* * * * *